US012578603B2

(12) United States Patent
Tomioka et al.

(10) Patent No.: US 12,578,603 B2
(45) Date of Patent: Mar. 17, 2026

(54) LIQUID CRYSTAL OPTICAL ELEMENT COMPRISING AN ALIGNMENT CONTROL LAYER HAVING A PLURALITY OF PROJECTIONS AND MANUFACTURING METHOD THEREOF

(71) Applicant: Japan Display Inc., Tokyo (JP)

(72) Inventors: Yasushi Tomioka, Tokyo (JP);
Shinichiro Oka, Tokyo (JP); Koichi Igeta, Tokyo (JP); Junji Kobashi, Tokyo (JP); Ayaka Higuchi, Tokyo (JP)

(73) Assignee: Japan Display Inc., Tokyo (JP)

( * ) Notice: Subject to any disclaimer, the term of this patent is extended or adjusted under 35 U.S.C. 154(b) by 274 days.

(21) Appl. No.: 18/363,134

(22) Filed: Aug. 1, 2023

(65) Prior Publication Data

US 2024/0045273 A1     Feb. 8, 2024

(30) Foreign Application Priority Data

Aug. 2, 2022    (JP) ................................. 2022-123429

(51) Int. Cl.
| | |
|---|---|
| *G02F 1/1337* | (2006.01) |
| *G02F 1/1347* | (2006.01) |
| *H10F 77/42* | (2025.01) |

(52) U.S. Cl.
CPC .. *G02F 1/133788* (2013.01); *G02F 1/133726* (2021.01); *G02F 1/13478* (2021.01); *H10F 77/42* (2025.01)

(58) Field of Classification Search
CPC ...................... G02F 1/133726; G02F 1/13478
See application file for complete search history.

(56) References Cited

U.S. PATENT DOCUMENTS

| | | | |
|---|---|---|---|
| 2004/0039150 A1* | 2/2004 | Shin ...................... | C09K 19/56 |
| | | | 528/289 |
| 2016/0033698 A1 | 2/2016 | Escuti et al. | |
| 2023/0168543 A1* | 6/2023 | Sekikawa ......... | G02F 1/133711 |
| | | | 349/123 |

FOREIGN PATENT DOCUMENTS

| | | | | |
|---|---|---|---|---|
| JP | 2005353207 A | * | 12/2005 | |
| JP | 2006171260 A | * | 6/2006 | |
| JP | 2017522601 A | | 8/2017 | |
| WO | WO-2022030481 A1 | * | 2/2022 | ....... G02F 1/133776 |

* cited by examiner

*Primary Examiner* — Paul C Lee
(74) *Attorney, Agent, or Firm* — Maier & Maier, PLLC

(57) ABSTRACT

According to one embodiment, a liquid crystal optical element includes a substrate, a first alignment control layer disposed on the substrate and comprising projections arranged at a predetermined pitch, and a first liquid crystal layer disposed on the first alignment control layer. The first liquid crystal layer comprises liquid crystal molecules which are aligned such that major axes of the liquid crystal molecules extend along the projections, respectively, and cured in a state where alignment directions of the liquid crystal molecules are fixed. The first alignment control layer is formed of a crosslinkable liquid crystal polymer.

13 Claims, 16 Drawing Sheets

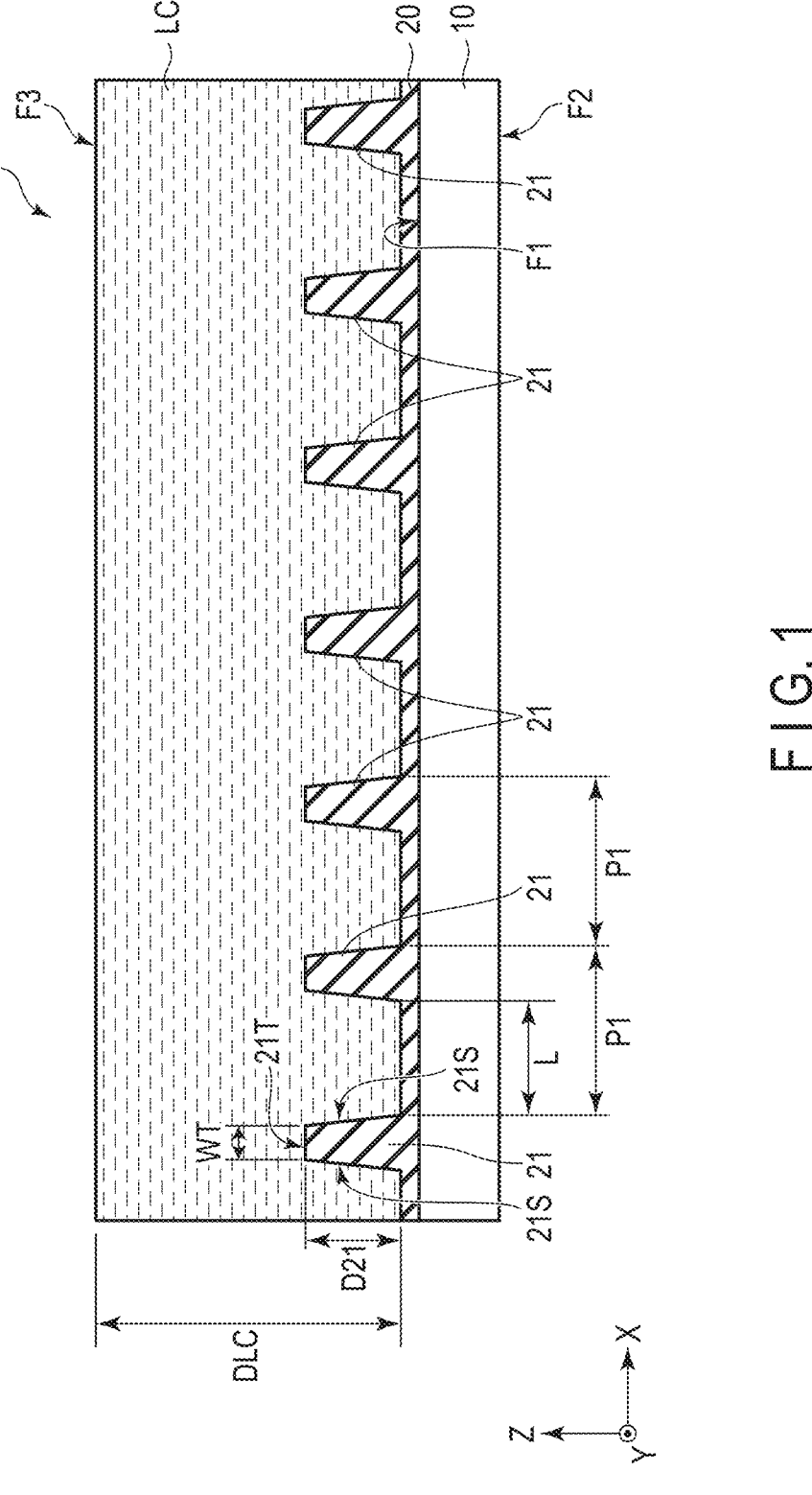
F I G. 1

FIG. 2

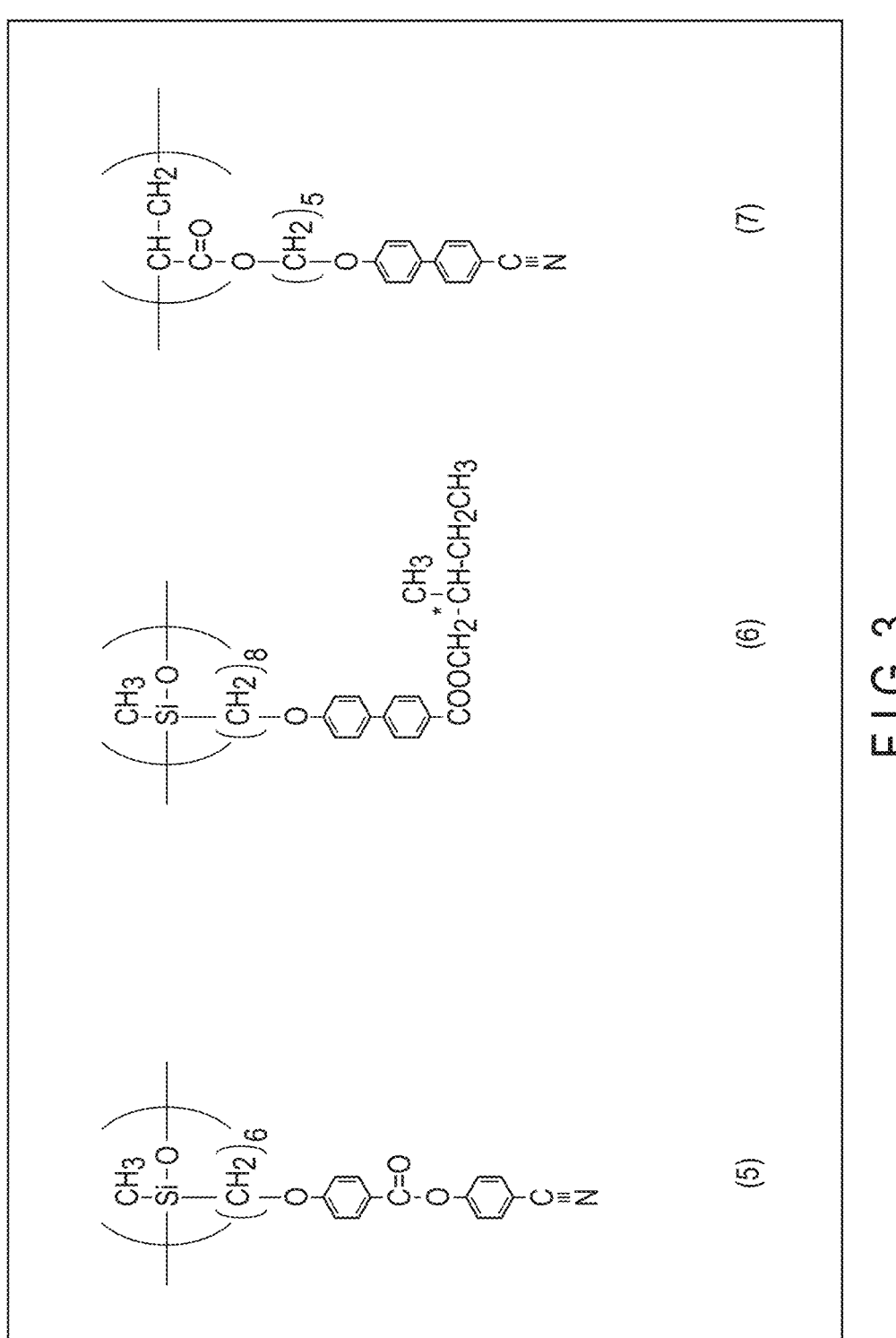
F I G. 3

F I G. 4

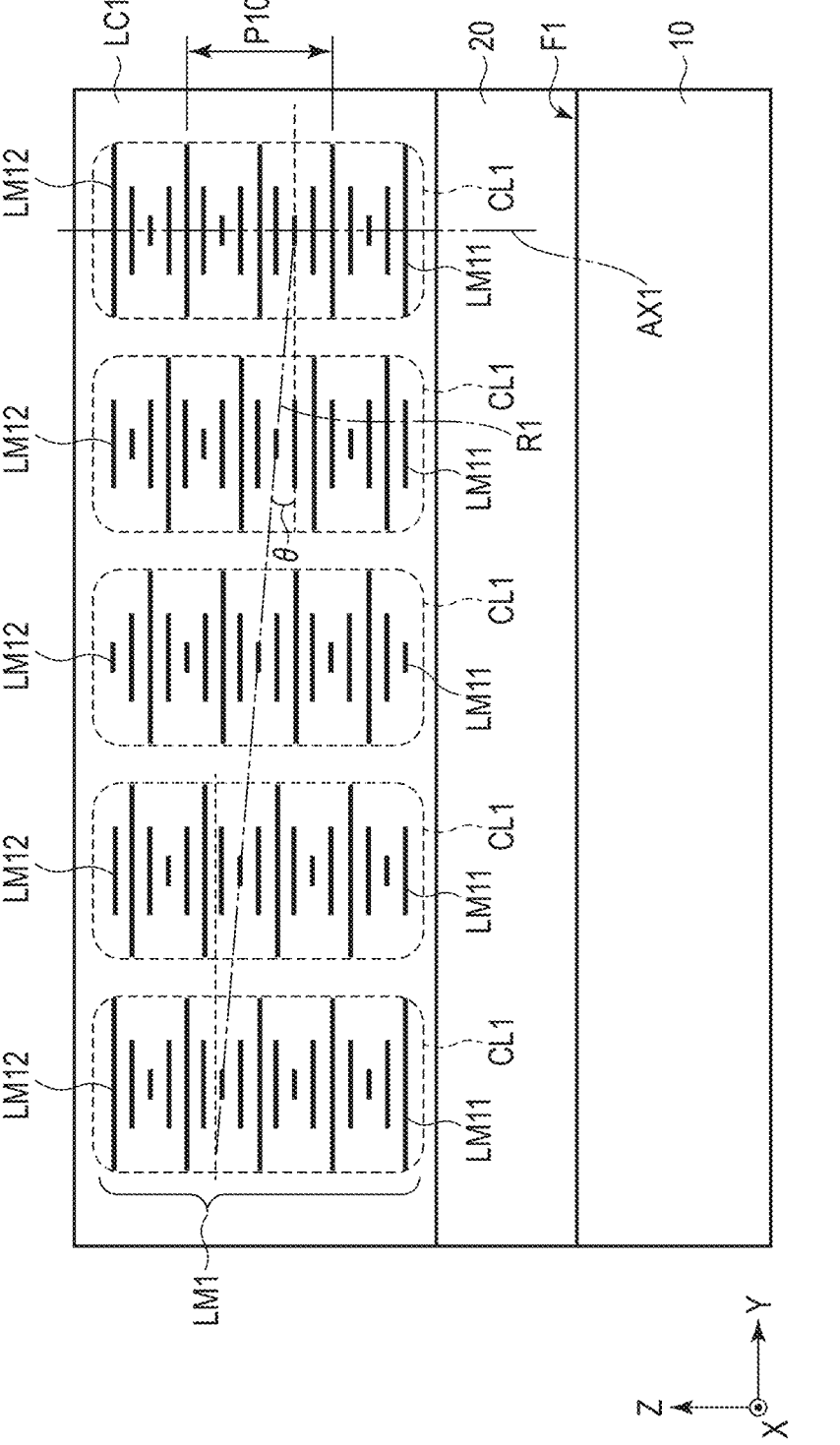
F I G. 5

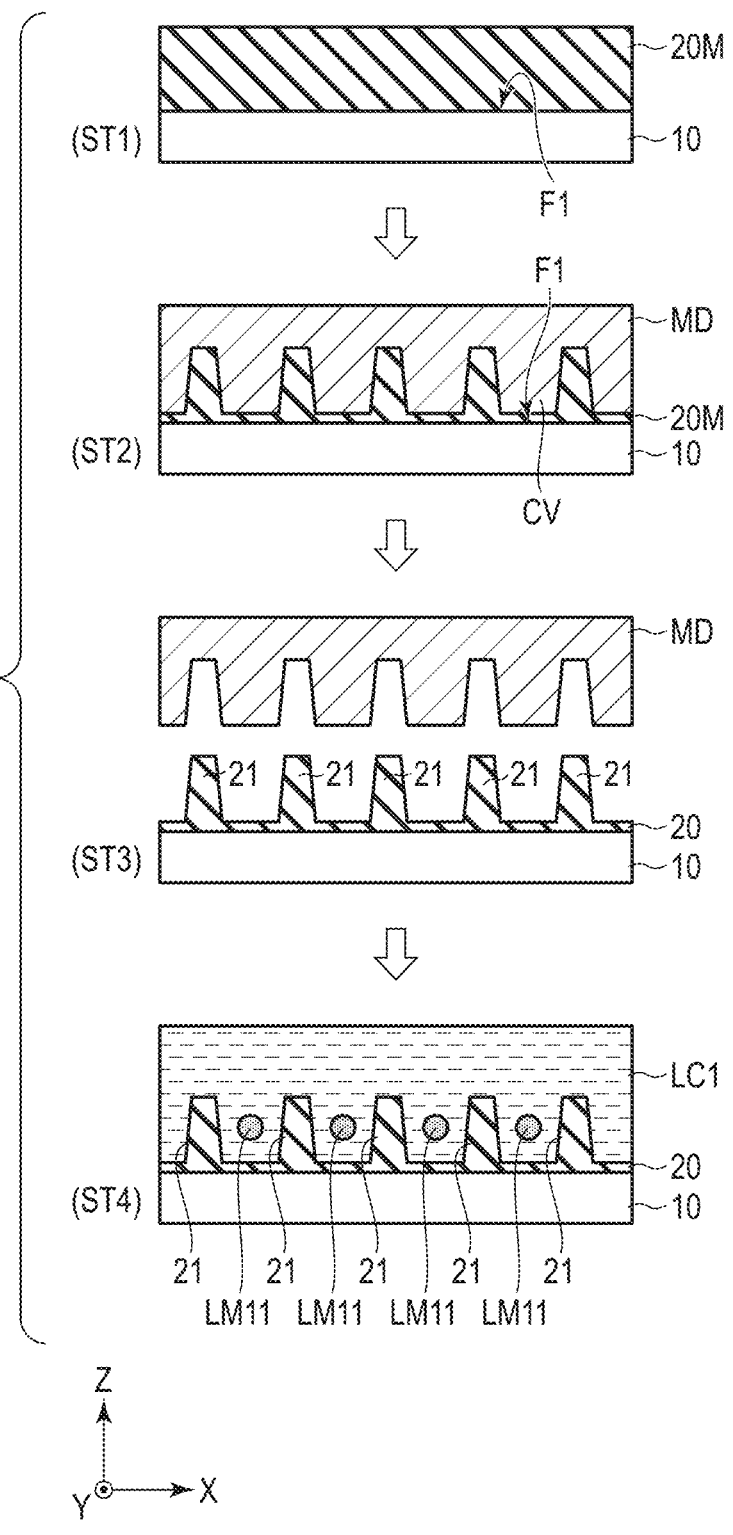
F I G. 7

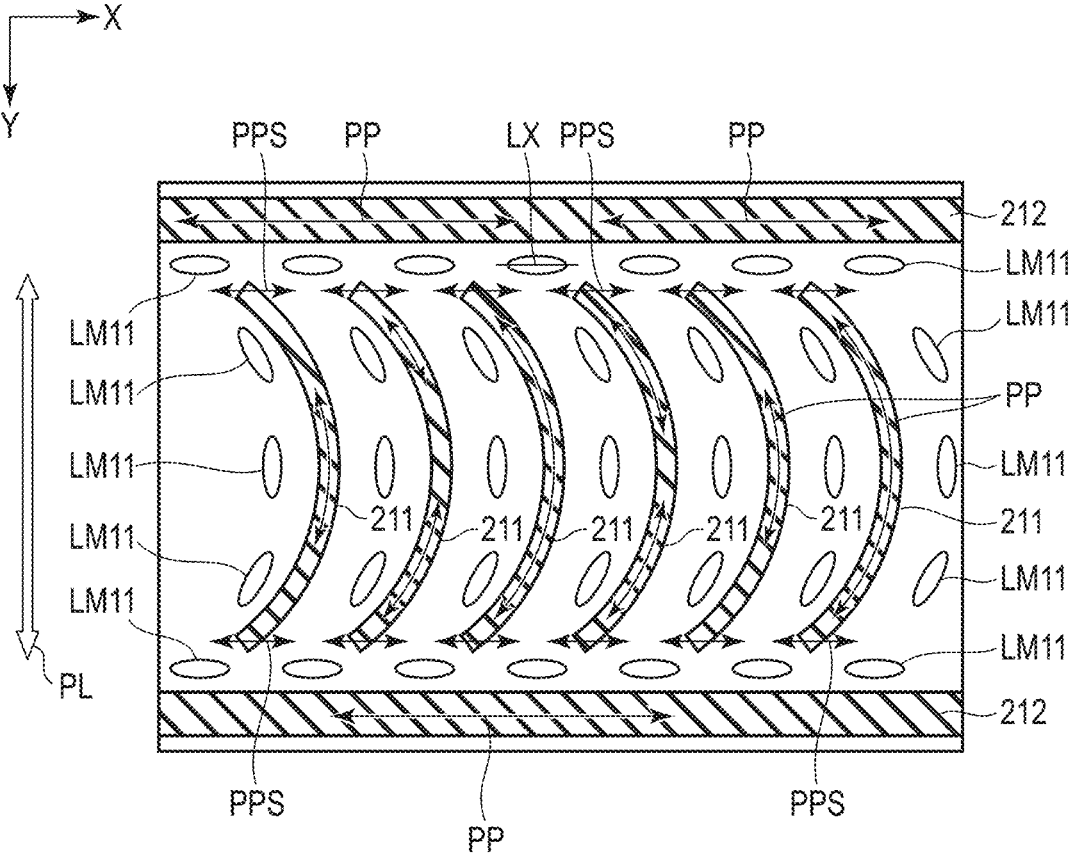
F I G. 11

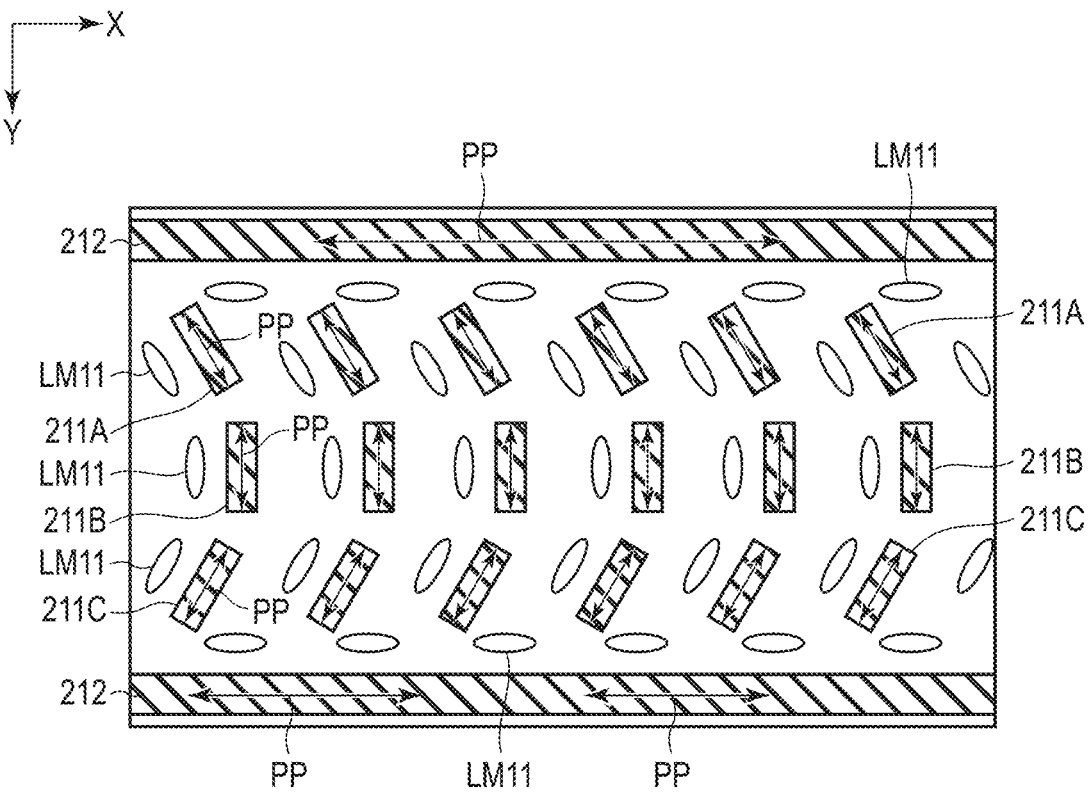
F I G. 12

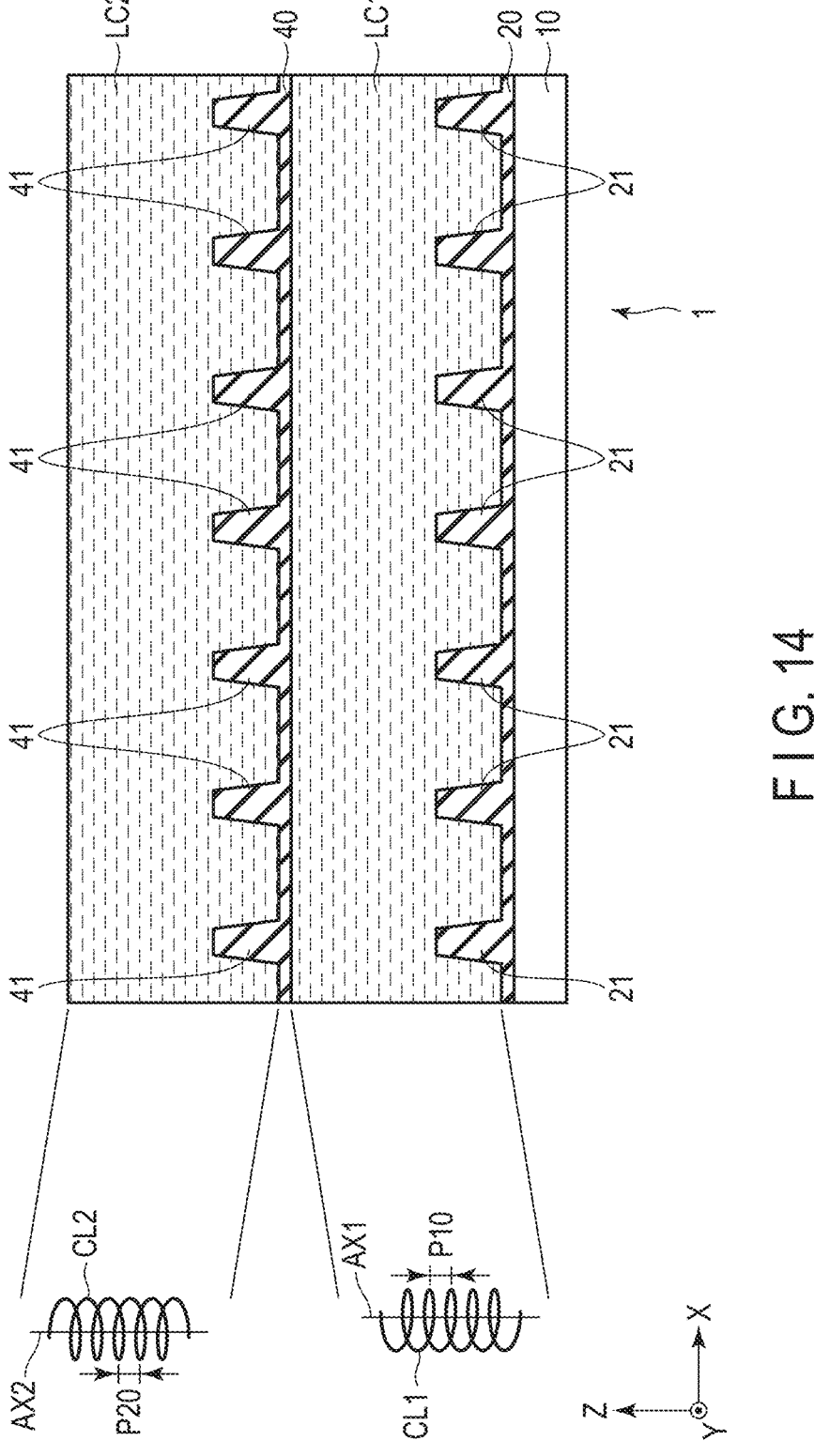
F I G. 14

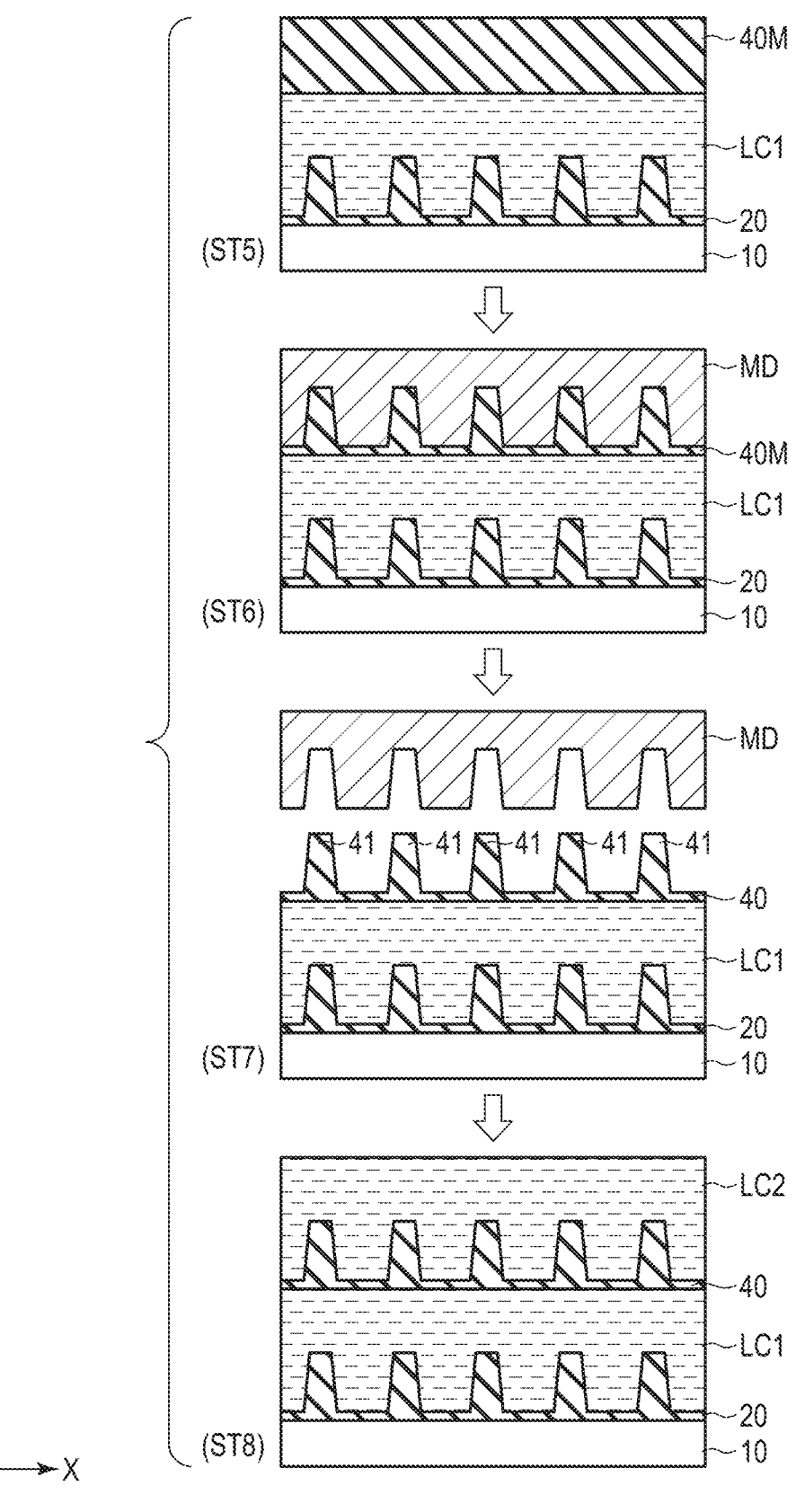
F I G. 15

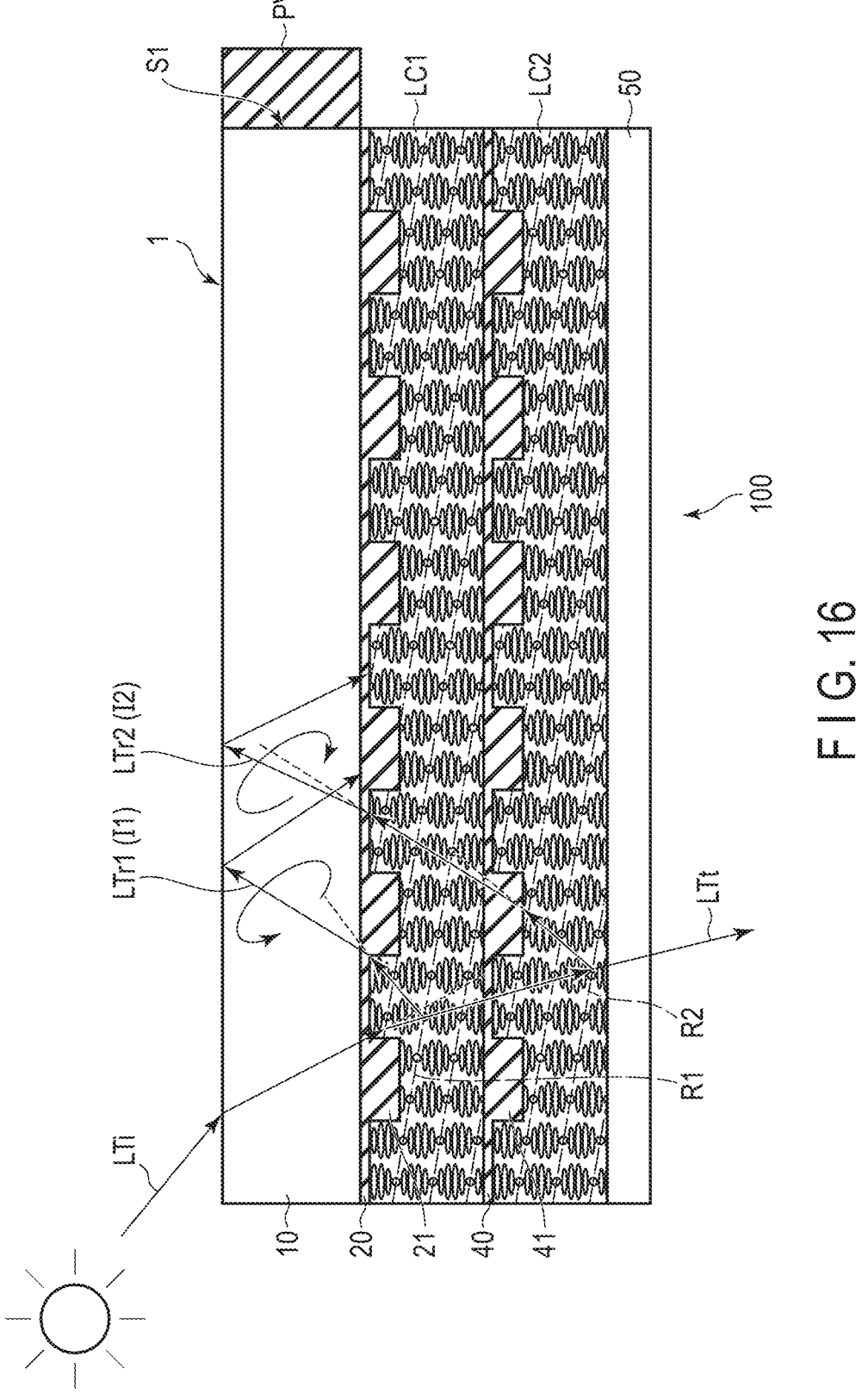
F I G. 16

LIQUID CRYSTAL OPTICAL ELEMENT COMPRISING AN ALIGNMENT CONTROL LAYER HAVING A PLURALITY OF PROJECTIONS AND MANUFACTURING METHOD THEREOF

CROSS-REFERENCE TO RELATED APPLICATIONS

This application is based upon and claims the benefit of priority from Japanese Patent Application No. 2022-123429, filed Aug. 2, 2022, the entire contents of which are incorporated herein by reference.

FIELD

Embodiments described herein relate generally to a liquid crystal optical element and a manufacturing method thereof.

BACKGROUND

For example, liquid crystal polarization gratings for which liquid crystal materials are used have been proposed. The liquid crystal polarization gratings are configured to change the propagation direction of light passing through their insides according to Bragg condition.

If the liquid crystal polarization gratings are realized, it is important to align liquid crystal molecules in a predetermined direction.

BRIEF DESCRIPTION OF THE DRAWINGS

FIG. 1 is a cross-sectional view showing a configuration example of a liquid crystal optical element 1 according to an embodiment.

FIG. 2 is a diagram showing examples of a crosslinkable liquid crystal polymer for forming an alignment control layer.

FIG. 3 is a diagram showing examples of the crosslinkable liquid crystal polymer for forming the alignment control layer.

FIG. 4 is a diagram showing examples of the crosslinkable liquid crystal polymer for forming the alignment control layer.

FIG. 5 is a cross-sectional view for explaining an example of cholesteric liquid crystals CL1 included in a liquid crystal layer LC1.

FIG. 7 is a diagram for explaining a manufacturing method of the liquid crystal optical element 1 shown in FIG. 1.

FIG. 11 is a plan view for explaining the alignment pattern of the liquid crystal molecules LM11 along the projections 21.

FIG. 12 is a plan view for explaining the alignment pattern of the liquid crystal molecules LM11 along other projections 21.

FIG. 14 is a cross-sectional view showing another configuration example of the liquid crystal optical element 1.

FIG. 15 is a diagram for explaining a manufacturing method of the liquid crystal optical element 1 shown in FIG. 13 or FIG. 14.

FIG. 16 is a cross-sectional view for explaining a photovoltaic cell device 100 which is an application example of the liquid crystal optical element 1.

DETAILED DESCRIPTION

Figure 6:
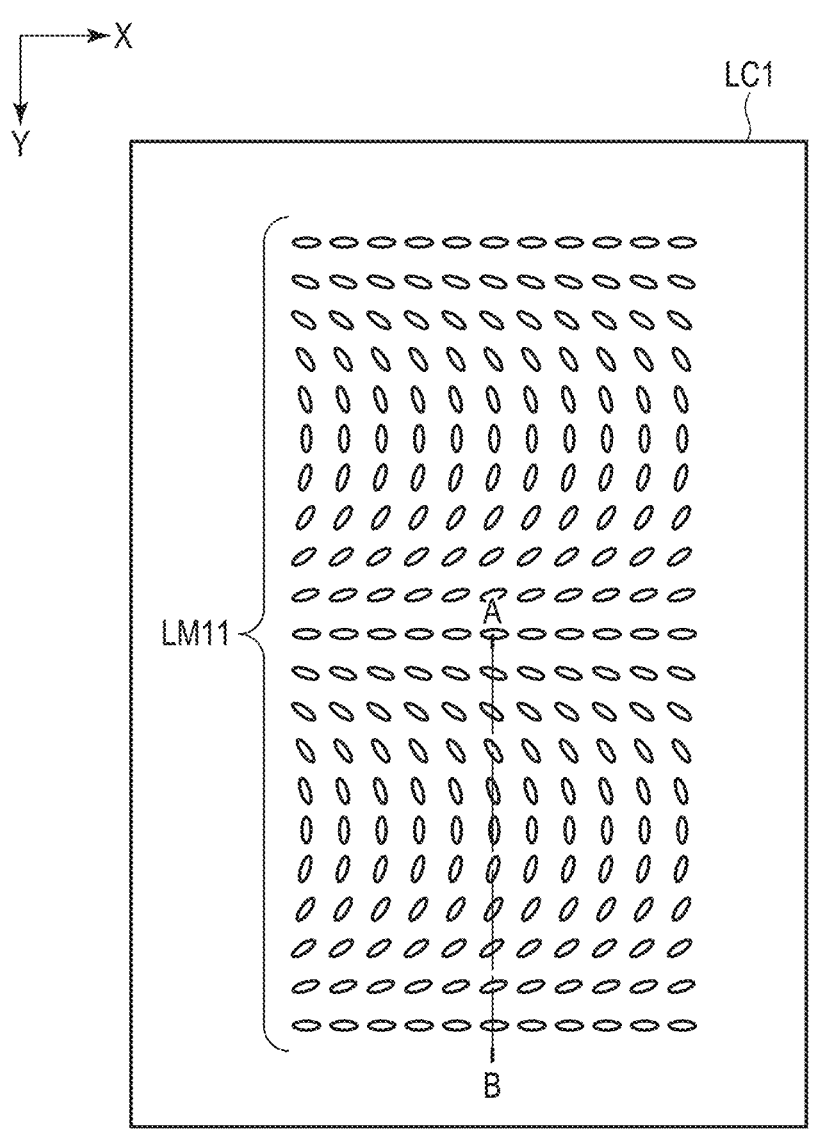
FIG. 6 is a plan view showing the alignment pattern of liquid crystal molecules in the liquid crystal layer LC1.

The embodiments described herein aim to provide a liquid crystal optical element and a manufacturing method thereof which can suppress an alignment defect in liquid crystal molecules.

In general, according to one embodiment, a liquid crystal optical element comprises a substrate, a first alignment control layer disposed on the substrate and comprising projections arranged at a predetermined pitch, and a first liquid crystal layer disposed on the first alignment control layer. The first liquid crystal layer comprises liquid crystal molecules which are aligned such that major axes of the liquid crystal molecules extend along the projections, respectively, and cured in a state where alignment directions of the liquid crystal molecules are fixed. The first alignment control layer is formed of a crosslinkable liquid crystal polymer.

According to another embodiment, a manufacturing method of a liquid crystal optical element, comprises applying a crosslinkable liquid crystal polymer on a substrate and forming a first alignment control layer comprising projections arranged at a predetermined pitch by a thermal nanoimprint method or a photo-nanoimprint method, and applying a liquid crystal material on the first alignment control layer, curing the liquid crystal material in a state where liquid crystal molecules included in the liquid crystal material are aligned in a predetermined direction according to alignment restriction force of the first alignment control layer, to form a first liquid crystal layer.

According to an embodiment, a liquid crystal optical element and a manufacturing method thereof which can suppress an alignment defect in liquid crystal molecules can be provided.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

Note that, in order to make the descriptions more easily understandable, some of the drawings illustrate an X axis, a Y axis and a Z axis orthogonal to each other. A direction along the X axis is referred to as an X direction or a first direction, a direction along the Y axis is referred to as a Y direction or a second direction and direction along the Z axis is referred to as a Z direction or a third direction. The first direction X and the second direction Y correspond to the directions parallel to a main surface of a substrate that constitutes the liquid crystal optical element. The third direction Z corresponds to a thickness direction of the liquid crystal optical element. A plane defined by the X axis and the Y axis is referred to as an X-Y plane, and a plane defined by the X axis and the Z axis is referred to as an X-Z plane. Further, viewing towards the X-Y plane is referred to as plan view.

FIG. 1 is a cross-sectional view showing a configuration example of a liquid crystal optical element 1. The liquid crystal optical element 1 comprises a substrate 10, an alignment control layer and a liquid crystal layer LC1.

The substrate 10 is a transparent substrate which transmits light, and is composed of, for example, a transparent glass plate or a transparent synthetic resin plate. The substrate 10 may be composed of, for example, a transparent synthetic resin plate having flexibility. The substrate 10 can assume an arbitrary shape. For example, the substrate 10 may be curved. The refractive index of the substrate 10 is, for example, greater than the refractive index of air.

In the present specification, "light" includes visible light and invisible light. For example, the wavelength of the lower limit of the visible light range is greater than or equal to 360 nm but less than or equal to 400 nm, and the wavelength of the upper limit of the visible light range is greater than or equal to 760 nm but less than or equal to 830 nm. Visible light includes a first component (blue component) of a first wavelength band (for example, 400 nm to 500 nm), a second component (green component) of a second wavelength band (for example, 500 nm to 600 nm), and a third component (red component) of a third wavelength band (for example, 600 nm to 700 nm). Invisible light includes ultraviolet rays of a wavelength band shorter than the first wavelength band and infrared rays of a wavelength band longer than the third wavelength band.

In the present specification, to be "transparent" should preferably be to be colorless and transparent. Note that to be "transparent" may be to be translucent or to be colored and transparent.

The substrate 10 is formed into the shape of a flat plate along the X-Y plane, and comprises a main surface F1 and a main surface F2. The main surface F1 and the main surface F2 are surfaces substantially parallel to the X-Y plane and are opposed to each other in the third direction Z. The main surface F2 contacts, for example, air, but may be covered by another thin film.

The alignment control layer 20 is disposed on the substrate 10 on the main surface F1 side. The alignment control layer 20 comprises projections 21 arranged in the first direction X at a predetermined pitch P1. Each of the projections 21 projects toward the liquid crystal layer LC1 in the third direction Z. The projections 21 have the function of defining the alignment directions of liquid crystal molecules included in the liquid crystal layer LC1, which will be described in detail later. In the example shown in the figure, the alignment control layer 20 covers the main surface F1 between the adjacent projections 21.

Note that the main surface F1 may be exposed through the alignment control layer 20 between the adjacent projections 21. If the alignment control layer 20 does not cover the space between the adjacent projections 21, an alignment film may be disposed between the substrate 10 and the alignment control layer 20.

In the X-Z plane, the projections 21 may have a cross-sectional shape tapering in the third direction Z or may have a substantially rectangular cross-sectional shape. Each of the projections 21 comprises a top 21T and a side surface 21S.

Each of the projections 21 has a substantially constant thickness D21 in the third direction Z. The top 21T of each of the projections 21 has a width WT in the first direction X. The projections 21 adjacent in the first direction X are arranged with a length L therebetween.

The thickness D21 is greater than the width WT of the tops 21T. For example, the thickness D21 is 100 nm to 2,000 nm and should preferably be 300 nm to 1,000 nm. The width WT is, for example, 50 nm to 1,500 nm and should preferably be 100 nm to 1,000 nm. The aspect ratio (D21/WT) between the thickness D21 and the width WT is, for example, approximately 2 to 4.

The length L is less than the thickness D21. For example, the length L is 50 nm to 1,500 nm and should preferably be 100 nm to 1,000 nm. The length L is, for example, approximately three times the width WT.

The liquid crystal layer LC1 is disposed on the alignment control layer 20, surrounds each of the projections 21, and contacts the tops 21T and the side surfaces 21S. Moreover, in the example shown in FIG. 1, the liquid crystal layer LC1 contacts the alignment control layer 20 between the adjacent projections 21. Liquid crystal molecules included in the liquid crystal layer LC1 are aligned in a predetermined direction according to the alignment restriction force of the alignment control layer 20, which will be described later. The liquid crystal layer LC1 is cured in a state where the alignment directions of the liquid crystal molecules are fixed. That is, the alignment directions of the liquid crystal molecules are not controlled in accordance with an electric field. For this reason, the liquid crystal optical element 1 does not comprise an electrode for alignment control. The liquid crystal layer LC1 is formed by, for example, giving energy such as light or heat to a monomer which is a liquid crystal material and polymerizing the monomer.

The liquid crystal layer LC1 has a thickness DLC in the third direction Z. The thickness DLC of the liquid crystal layer LC1 is greater than the thickness D21 of the projections 21. For example, the thickness DLC is 1,000 nm to 14,000 nm and should preferably be 5,000 nm to 12,000 nm.

In the example shown in FIG. 1, another thin film or substrate is not overlaid on the liquid crystal layer LC1 in the third direction Z. That is, the liquid crystal layer LC1 comprises a main surface F3 which is in contact with air. The main surface F3 can be covered by another thin film such as a protective film.

The alignment control layer 20 is formed of a transparent organic material and is formed of a thermally crosslinkable liquid crystal polymer or a photo-crosslinkable liquid crystal polymer. The refractive index of the alignment control layer 20 is equal to the refractive index of the substrate 10. Thus, light reaching the interface between the substrate 10 and the alignment control layer 20 is hardly refracted. If the material forming the alignment control layer 20 has refractive anisotropy, the refractive index of the alignment control layer 20 is the average refractive index corresponding to the average value of a refractive index for extraordinary light and a refractive index for ordinary light.

Figure 2:
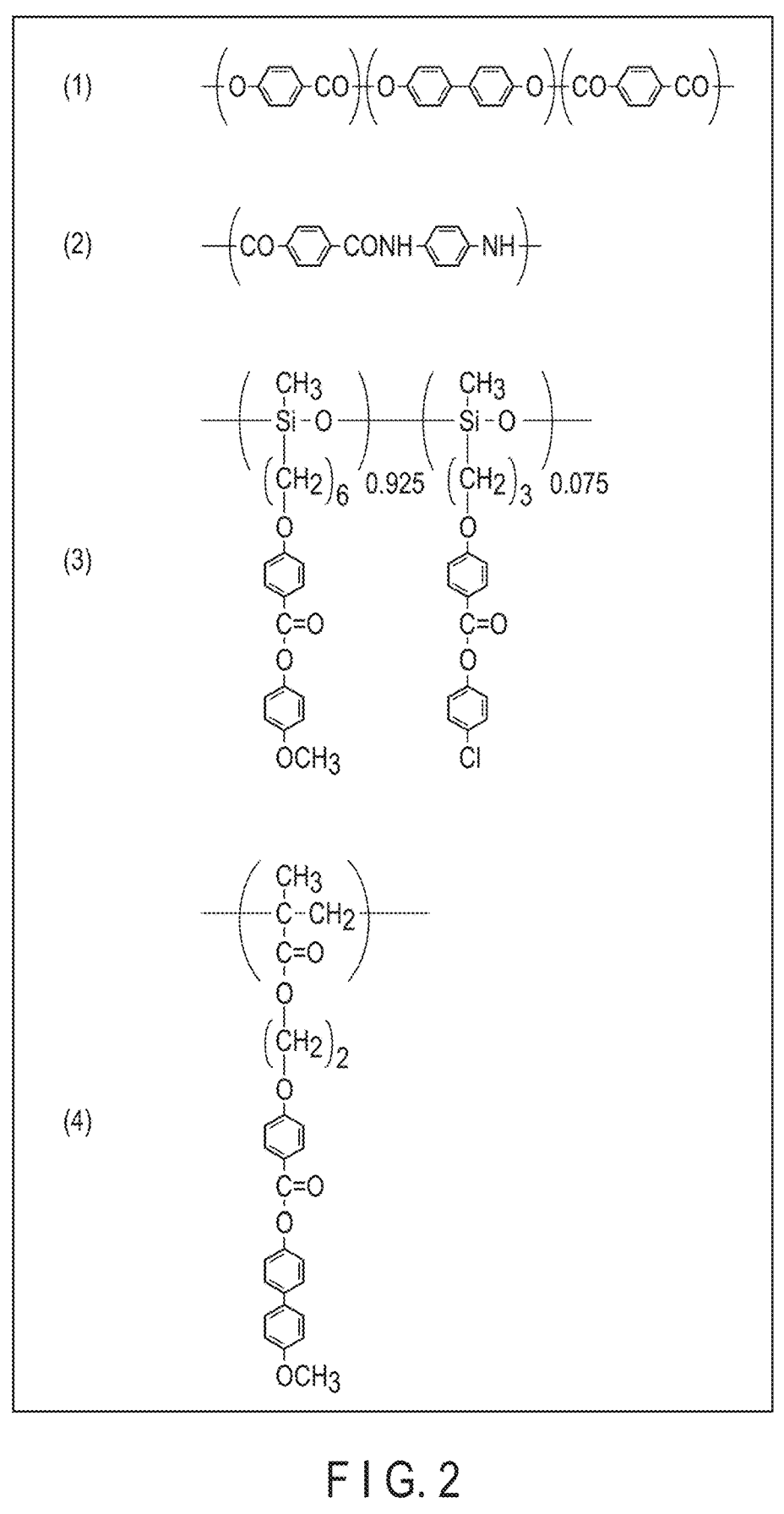
Figure 4:
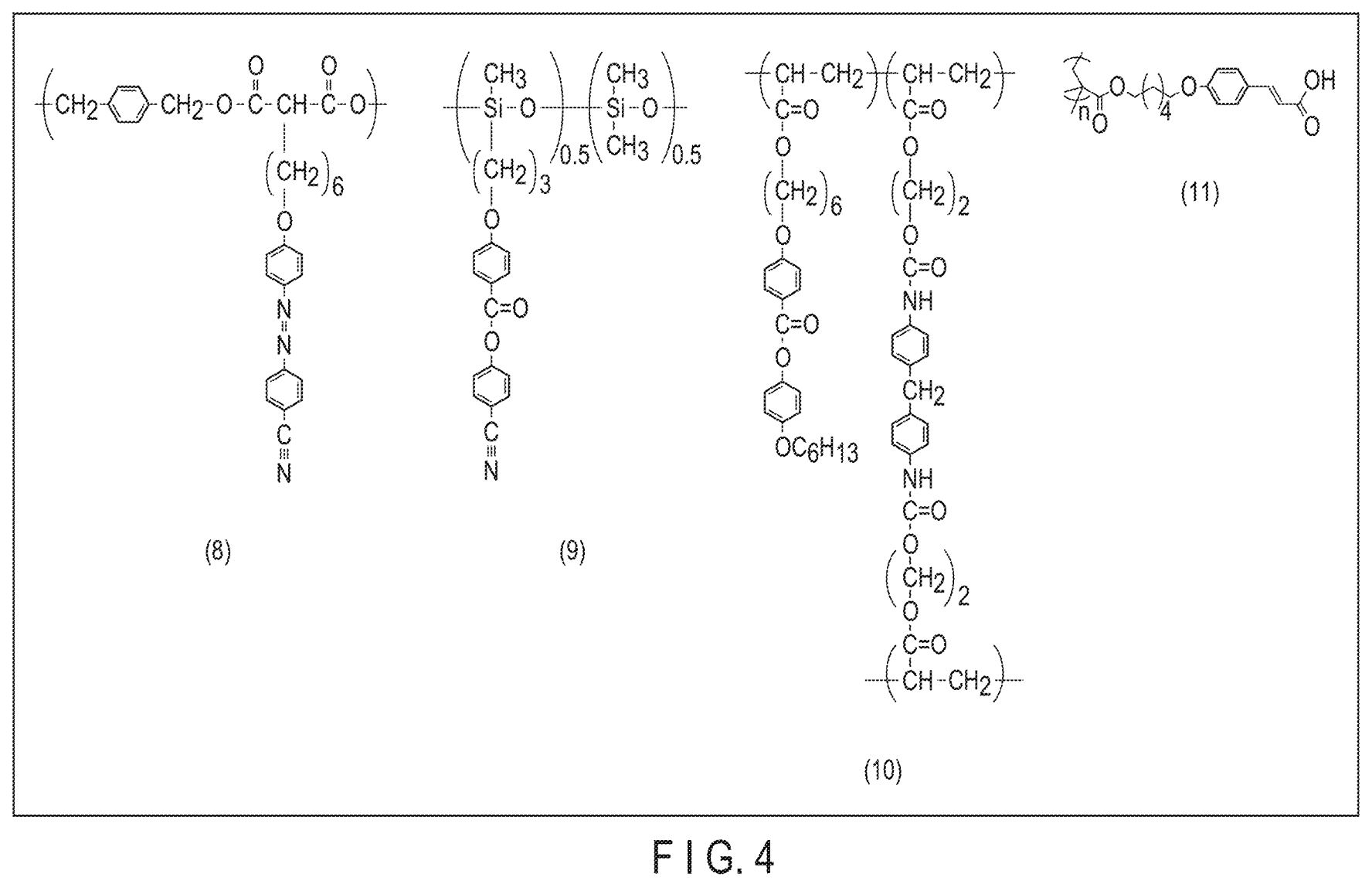

FIG. 2 to FIG. 4 are diagrams showing examples of a crosslinkable liquid crystal polymer for forming the alignment control layer 20.

As shown in FIG. 2, material example (1) is a polyester exhibiting thermotropic liquid crystallinity, material example (2) is an aromatic polyamide exhibiting lyotropic liquid crystallinity, material example (3) is a side chain siloxane copolymer, and material example (4) is a side chain polymethyl methacrylate.

As shown in FIG. 3, material example (5) is a smectic side chain polysiloxane, material example (6) is a side chain polysiloxane, and material example (7) is a cyanobiphenyl-based polyacrylate.

As shown in FIG. 4, material example (8) is a cyanoazobenzene polyester, material example (9) is a side chain silicone polymer, material example (10) is a methacrylic elastomer, and material example (11) is a methacrylic polymer containing cinnamic acid in a side chain.

Of the material examples, for example, material examples (8) and (11) are photo-alignable liquid crystal polymers which produce alignment restriction force in a predetermined direction by being irradiated with linearly polarized light such as linearly polarized ultraviolet rays. In addition, material examples (8) and (11) are liquid crystal polymers containing azobenzene exhibiting cis-trans photoisomerization as a photo-alignable chromophore and cinnamic acid exhibiting photodimerization, respectively, as side chains and produce alignment restriction force orthogonal to the polarization axis of linearly polarized light by being irradiated with the linearly polarized light.

FIG. 5 is a cross-sectional view for explaining an example of cholesteric liquid crystals CL1 included in the liquid crystal layer LC1.

In FIG. 5, the liquid crystal layer LC1 is shown in a state of being enlarged in the third direction Z. The liquid crystal layer LC1 comprises the cholesteric liquid crystals CL1. For the sake of simplification, one liquid crystal molecule LM1 of the liquid crystal molecules located in the same plane parallel to the X-Y plane is shown in the figure as liquid crystal molecules LM1 constituting the cholesteric liquid crystals CL1. The alignment direction of the liquid crystal molecule LM1 shown in the figure corresponds to the average alignment direction of the liquid crystal molecules located in the same plane.

Each cholesteric liquid crystal CL1 enclosed by a broken line is constituted of liquid crystal molecules LM1 stacked helically in the third direction Z while being turned. A helical axis AX1 of the cholesteric liquid crystals CL1 is parallel to the third direction Z or a normal of the substrate 10. The cholesteric liquid crystals CL1 have a helical pitch P10 in the third direction Z.

The liquid crystal molecules LM1 comprise liquid crystal molecules LM11 on one end side of the cholesteric liquid crystals CL1 and liquid crystal molecules LM12 on the other end side of the cholesteric liquid crystals CL1. The liquid crystal molecules LM11 are close to the alignment control layer 20. Here, the projections of the alignment control layer 20 are omitted from the figure.

In the liquid crystal layer LC1, the alignment directions of the cholesteric liquid crystals CL1 adjacent in the second direction Y are different from each other.

The alignment directions of the liquid crystal molecules LM11 adjacent in the second direction Y are different from each other. The alignment directions of the liquid crystal molecules LM11 change continuously in the second direction Y.

The alignment directions of the liquid crystal molecules LM12 adjacent in the second direction Y are also different from each other. The alignment directions of the liquid crystal molecules LM12 also change continuously in the second direction Y.

A reflective surface R1 of the liquid crystal layer LC1 indicated by an alternate long and short dashed line in the figure is inclined with respect to the X-Y plane or the main surface F1. The angle θ formed by the reflective surface R1 and the X-Y plane is an acute angle. The reflective surface R1 corresponds to a surface along which the alignment directions of the liquid crystal molecules LM1 are identical or a surface along which the spatial phases are identical (equiphase wave surface).

In general, in a liquid crystal layer comprising a cholesteric liquid crystal, a selective reflection band Δλ for perpendicularly incident light is expressed as equation (1) below, based on the helical pitch P of the cholesteric liquid crystal and the refractive anisotropy Δn (difference between the refractive index ne for extraordinary light and the refractive index no for ordinary light) of the liquid crystal layer.

$$\Delta\lambda = \Delta n * P \tag{1}$$

The specific wavelength range of the selective reflection band ΔΔ is no*P to ne*P.

FIG. 6 is a plan view showing the alignment pattern of the liquid crystal molecules in the liquid crystal layer LC1.

FIG. 6 shows an example of the spatial phases of the cholesteric liquid crystals CL1. The spatial phases here are shown as the alignment directions of the liquid crystal molecules LM11 located close to the alignment control layer 20 of the liquid crystal molecules LM1 included in the cholesteric liquid crystals CL1. The alignment directions of the liquid crystal molecules LM11 here correspond to the major-axis directions of the liquid crystal molecules LM11 in the X-Y plane.

The alignment directions of the liquid crystal molecules LM11 arranged in the second direction Y are different from each other. That is, the spatial phases of the cholesteric liquid crystals CL1 adjacent in the second direction Y are different from each other.

On the other hand, the alignment directions of the liquid crystal molecules LM11 arranged in the first direction X are substantially identical. That is, the spatial phases of the cholesteric liquid crystals CL1 adjacent in the first direction X are substantially identical to each other.

For example, the respective alignment directions of the liquid crystal molecules LM11 arranged along line A-B change by equal angles clockwise in the second direction Y (from the top to the bottom of the figure). Here, the amount of change of the alignment directions of the liquid crystal molecules LM11 adjacent to each other is constant in the second direction Y, but may increase gradually or may decrease gradually.

As a result, as in the liquid crystal layer LC1 shown in FIG. 5, the reflective surface R1 inclined with respect to the X-Y plane is formed.

A manufacturing method of the liquid crystal optical element 1 shown in FIG. 1 will be described next with reference to FIG. 7.

First, in step ST1, a transparent material 20M for forming the alignment control layer 20 is applied to the main surface F1 of the substrate 10. The material 20M applied here is one of the crosslinkable liquid crystal polymers shown in FIG. 2 to FIG. 4.

Then, in step ST2, a mold MD in which recessed portions corresponding to the shapes of the projections 21 are formed in advance is prepared, and the mold MD is overlaid on the material 20M. Here, if a thermal nanoimprint method is applied, all of the mold MD and the substrate 10 are heated to a predetermined temperature while the mold MD is being pressurized. In addition, if a photo-nanoimprint method is applied, light including a wavelength with which the material 20M cures (for example, ultraviolet rays) is irradiated, while the mold MD is being pressurized. In this way, the material 20M cures into the shape corresponding to the recessed portions of the mold MD.

If the above-described crosslinkable liquid crystal polymers are uniaxially alignable polymers polymerized in a state of being aligned parallel to the longitudinal directions of the projections 21, the longitudinal directions of the projections 21 are parallel to the direction of the main chain, and alignment restriction force which tends to align liquid crystal molecules in the direction of the main chain is produced.

Then, in step ST3, the mold MD is removed. The alignment control layer 20 comprising the projections 21 is thereby formed.

In the example shown in the figure, in step ST2, the curing of the material 20M is performed in a state where projecting portions CV of the mold MD are separated from the main surface F1. Thus, the main surface F1 between the projections 21 is covered by the alignment control layer 20.

In addition, when the mold MD is pressurized, the curing of the material 20M may be performed in a state where the projecting portions CV and the main surface F1 are in contact with each other. In this case, the main surface F1 between the projections 21 is exposed through the alignment control layer 20.

Then, in step ST4, the liquid crystal layer LC1 is formed on the alignment control layer 20. The liquid crystal layer LC1 is formed, for example, in the following manner. First, a liquid crystal material is applied to be in contact with the alignment control layer 20. Then, in a state where liquid crystal molecules included in the liquid crystal material are aligned in a predetermined direction by the alignment control layer 20, light such as ultraviolet rays is irradiated and the liquid crystal material is cured. The liquid crystal layer LC1 is thereby formed.

However, in the steps before the liquid crystal material is cured, the alignment directions of the liquid crystal molecules included in the liquid crystal material are fixed in the following manner. That is, the liquid crystal molecules LM11 close to the alignment control layer 20 are horizontally aligned along the X-Y plane by alignment restriction force produced in the alignment control layer 20, and are aligned such that the major axes of the liquid crystal molecules LM11 extend along tangential lines of the projections 21. The alignment directions of other liquid crystal molecules overlapping the liquid crystal molecules LM11 in the third direction Z are determined with the liquid crystal molecules LM11 as the starting points.

After the alignment directions of the other liquid crystal molecules are fixed according to the alignment directions of the liquid crystal molecules LM11, the curing of the liquid crystal material is performed.

If material example (8) or material example (11), described above, is applied as the material 20M for forming the alignment control layer 20, it is preferable that the photoalignment treatment of the alignment control layer 20 be performed before the formation of the liquid crystal layer LC1 in step ST4. In the photoalignment treatment, the alignment control layer 20 is irradiated with linearly polarized ultraviolet rays.

Figure 8:
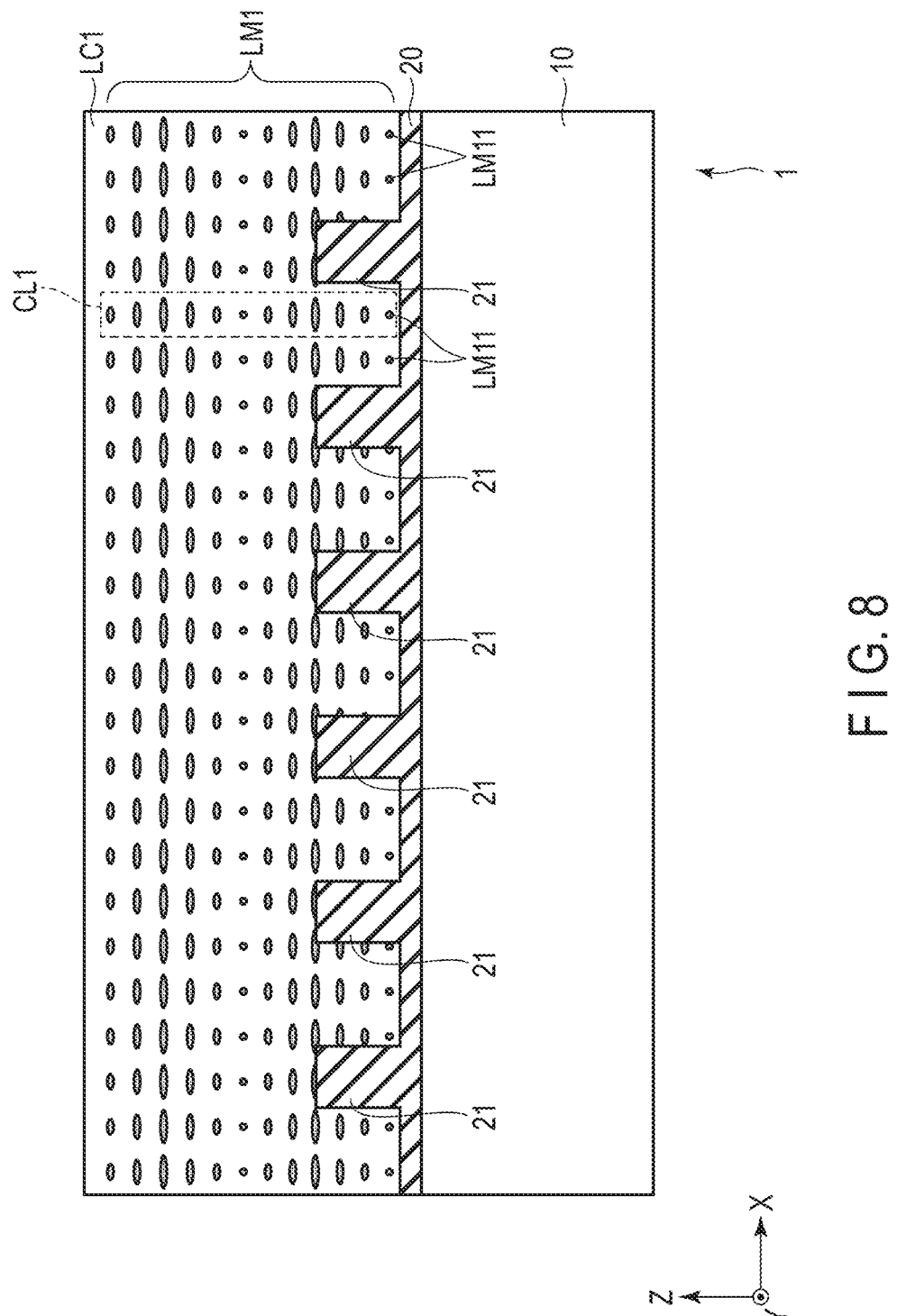
FIG. 8 is a cross-sectional view showing a configuration example of the liquid crystal optical element 1.

FIG. 8 is a cross-sectional view showing a configuration example of the liquid crystal optical element 1.

The example shown in FIG. 8 corresponds to a case where a chiral agent has been added to the liquid crystal material applied to be in contact with the alignment control layer 20 in the manufacturing method described with reference to FIG. 7. In this case, the liquid crystal molecules LM1 included in the liquid crystal material are stacked in the third direction Z while being turned with the liquid crystal molecules LM11 close to the alignment control layer 20 as the starting points, and form the cholesteric liquid crystals CL1.

Figure 9:
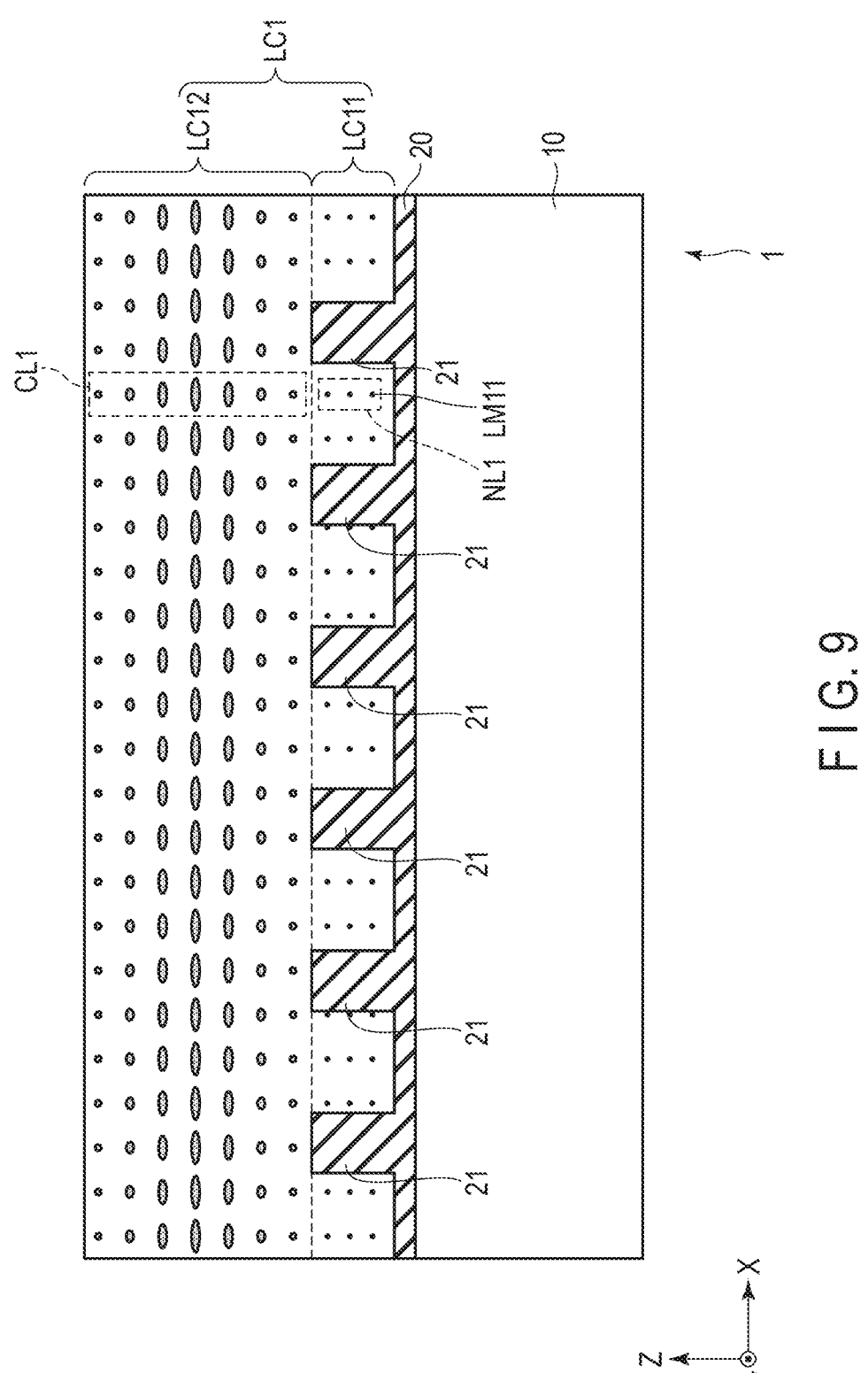
FIG. 9 is a cross-sectional view showing another configuration example of the liquid crystal optical element 1.

FIG. 9 is a cross-sectional view showing another configuration example of the liquid crystal optical element 1.

In the example shown in FIG. 9, the liquid crystal layer LC1 comprises a first layer LC11 covering the alignment control layer 20 and a second layer LC12 disposed on the first layer LC11.

The first layer LC11 comprises nematic liquid crystals NL1 in which the alignment directions of liquid crystal molecules are identical. The second layer LC12 comprises the cholesteric liquid crystals CL1. The cholesteric liquid crystals CL1 are formed by stacking liquid crystal molecules in the third direction Z while turning them with the liquid crystal molecules included in the nematic liquid crystals NL1 of the first layer LC11 as the starting points.

In the manufacturing method described with reference to FIG. 7, the step of forming the liquid crystal layer LC1 includes the step of forming the first layer LC11 and the step of forming the second layer LC12.

In the step of forming the first layer LC11, for example, a photo-crosslinkable nematic liquid crystal material is applied on the alignment control layer 20, the alignment directions of liquid crystal molecules included in the liquid crystal material are fixed, and then, the curing of the liquid crystal material is performed by irradiating light.

In the step of forming the second layer LC12, for example, a photo-crosslinkable cholesteric liquid crystal material is applied on the first layer LC11, the alignment directions of liquid crystal molecules included in the liquid crystal material are fixed, and then, the curing of the liquid crystal material is performed by irradiating light.

Figure 10:
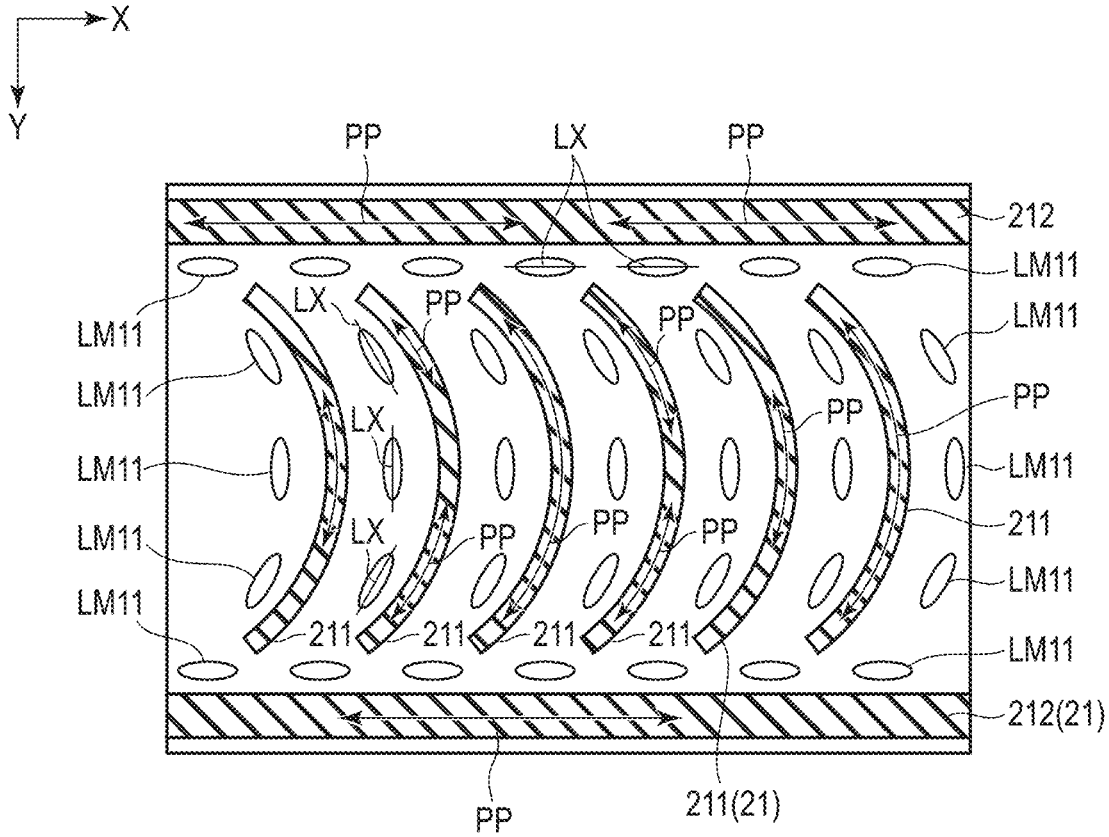
FIG. 10 is a plan view for explaining the alignment pattern of liquid crystal molecules LM11 along projections 21.

FIG. 10 is a plan view for explaining the alignment pattern of the liquid crystal molecules LM11 along the projections 21.

The projections 21 included in the alignment control layer 20 include, in plan view, projections 211 curved into the shapes of arches and projections 212 extending straight. The projections 211 and the projections 212 are separated from each other.

The projections 211 each have the same shape that projects toward the tip of the arrow indicating the first direction X in plan view. The projections 212 extend in the first direction X. The projections 211 are arranged in the first direction X, and are disposed between the two projections 212.

The alignment control layer 20 has alignment restriction force due to the periodicity of the projections 21. In addition, if the alignment control layer 20 is a uniaxially alignable liquid crystal polymer, the alignment control layer 20 has alignment restriction force PP in the longitudinal directions of the projections 21 or along the main chain of the liquid crystal polymer. In this manner, since the alignment control layer 20 is formed of a liquid crystal polymer, the alignment restriction force of the alignment control layer 20 is increased.

For example, the liquid crystal molecules LM11 between the projections 211 adjacent in the first direction X are aligned such that their major axes LX extend in the extension directions of the projections 211 (or the tangential directions of the projections 211). Similarly, the liquid crystal molecules LM11 along the projections 212 are also aligned such that their major axes LX extend in the extension directions of the projections 212.

In this manner, since the alignment restriction force of the alignment control layer 20 increased, an alignment defect in the liquid crystal molecules can be suppressed even with a complex alignment pattern.

In addition, since the alignment restriction force of the alignment control layer 20 is increased, a desired alignment pattern can be formed stably even if the pitch P1 of the projections 21 is enlarged or the aspect ratio (D21/WT) of the projections 21 is reduced.

Moreover, by enlarging the pitch P1 of the projections 21 or reducing the aspect ratio (D21/WT) of the projections 21, the mold MD applied to a nanoimprint method can be easily manufactured and the manufacturing cost can be reduced.

Furthermore, the minute projections 21 for defining the alignment directions of the liquid crystal molecules can be formed easily by the nanoimprint method with the mold MD. It is therefore possible to mass-produce liquid crystal optical elements 1 having desired optical properties.

FIG. 11 is a plan view for explaining the alignment pattern of the liquid crystal molecules LM11 along the projections 21.

In the example shown in FIG. 11, material example (8), described above, is applied as the material 20M for forming the alignment control layer 20. In addition, before the liquid crystal layer LC1 is formed, the alignment control layer 20 is irradiated with linearly polarized ultraviolet rays having a polarization axis PL in the second direction Y as the optical alignment treatment for the alignment control layer 20. A liquid crystal polymer corresponding to material example (8) includes a photo-alignable chromophore as a side chain. Such a side chain produces alignment restriction force orthogonal to linearly polarized light by being irradiated with linearly polarized ultraviolet rays.

For example, the projections 211 shown in the figure are irradiated with linearly polarized ultraviolet rays having the polarization axis PL. The projections 211 thereby produce alignment restriction force PPS indicated by arrows in the figure. Therefore, in the area between the projections 211 and the projections 212, liquid crystal molecules LM11 are aligned such that their major axes LX extend in the first direction X, by the alignment restriction force PP of the projections 212 and the alignment restriction force PPS of the projections 211.

As shown in the figure, the longitudinal directions of the projections 211 are not parallel to the longitudinal directions of the projections 212. For this reason, the alignment restriction force PP of the projections 211 acts in a direction different from that of the alignment restriction force PP of the projections 212. In this manner, in the area where the alignment restriction forces PP in different directions counteract each other, the alignment restriction force PPS produced in the projections 211 acts in a direction parallel to the alignment restriction force PP of the projections 212. An alignment defect in the liquid crystal molecules thereby can be suppressed.

In the examples shown in FIG. 10 and FIG. 11, for example, the projections 211 correspond to first projections, and the projections 212 correspond to second projections.

FIG. 12 is a plan view for explaining the alignment pattern of the liquid crystal molecules LM11 along other projections 21.

The example shown in FIG. 12 is different from the example shown in FIG. 10 in that the projections 21 include projections 211A, 211B, and 211C each extending straight. The projections 211A, 211B, and 211C extend in directions different from each other, are arranged in the second direction Y, and are located between the two projections 212.

Each of the projections 211A, 211B, 211C, and 212 has alignment restriction force PP indicated by arrows in the figure.

In this example, too, the same advantage as that of the example shown in FIG. 10 can be achieved.

In the example shown in FIG. 12, for example, the projections 211A correspond to first projections, and the projections 211B correspond to second projections.

Figure 13:
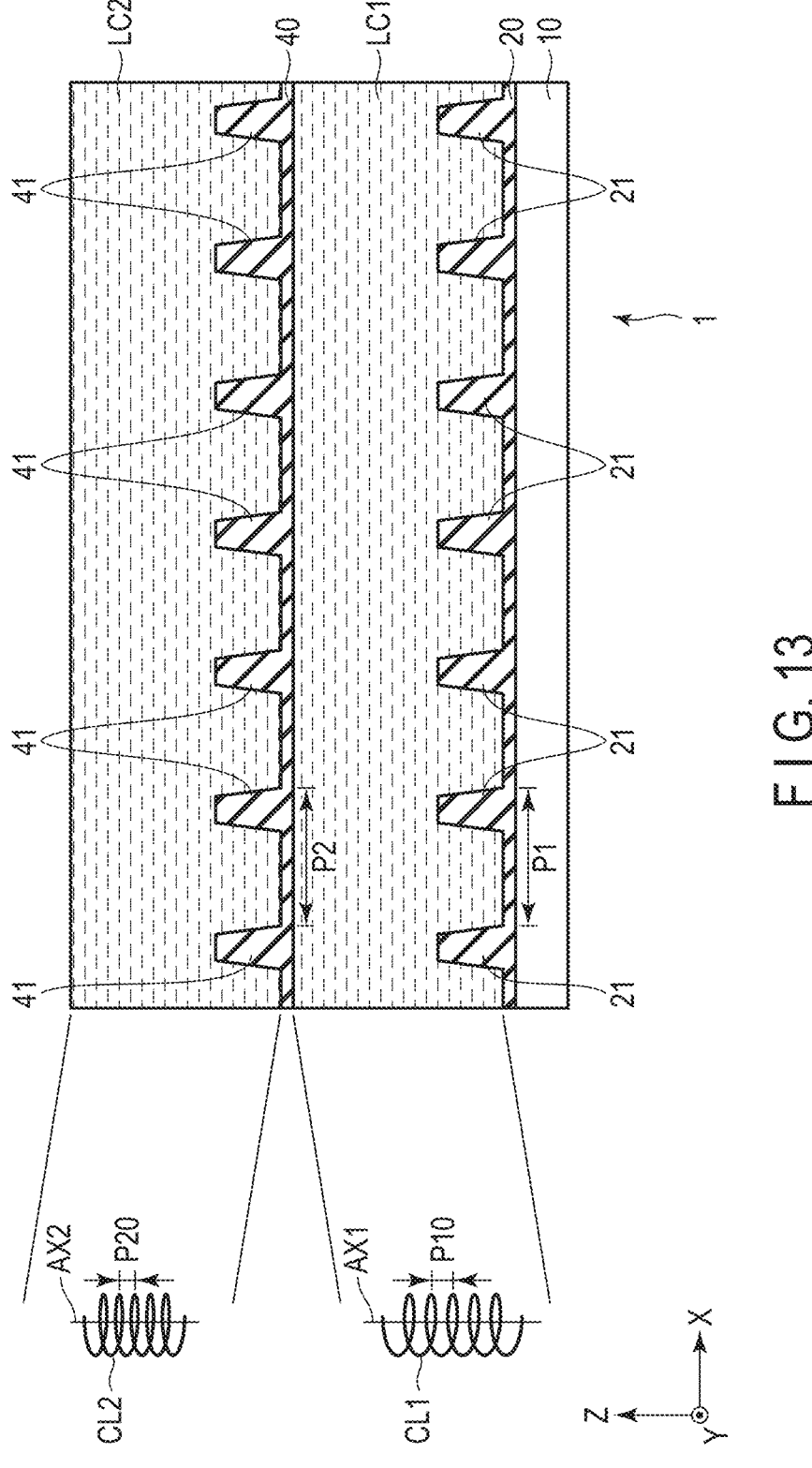
FIG. 13 is a cross-sectional view showing another configuration example of the liquid crystal optical element 1.

FIG. 13 is a cross-sectional view showing another configuration example of the liquid crystal optical element 1.

The liquid crystal optical element 1 comprises the substrate 10, the alignment control layer the liquid crystal layer LC1, an alignment control layer 40, and a liquid crystal layer LC2.

The alignment control layer 20 is disposed on the substrate 10 and comprises the projections 21 arranged at the predetermined pitch P1. The liquid crystal layer LC1 is disposed on the alignment control layer 20. The liquid crystal layer LC1 comprises the cholesteric liquid crystal CL1 as schematically shown.

The alignment control layer 40 is disposed on the liquid crystal layer LC1, and comprises projections 41 arranged at a predetermined pitch P2. The alignment control layer 40 is formed of a crosslinkable liquid crystal polymer, like the alignment control layer 20. The pitch P2 may be different from the pitch P1 or may be equal to the pitch P1. The liquid crystal layer LC2 is disposed on the alignment control layer 40. Like the liquid crystal layer LC1, the liquid crystal layer LC2 comprises liquid crystal molecules which are aligned such that their major axes extend along the projections 41, respectively, and is cured in a state where the alignment directions of the liquid crystal molecules are fixed. The liquid crystal layer LC2 comprises a cholesteric liquid crystal CL2 composed of liquid crystal molecules stacked helically in the third direction Z while being turned as schematically shown.

The helical axis AX1 of the cholesteric liquid crystal CL1 and a helical axis AX2 of the cholesteric liquid crystal CL2 are parallel to each other. The cholesteric liquid crystal CL1 has the helical pitch P10 in the third direction Z, and the cholesteric liquid crystal CL2 has a helical pitch P20 in the third direction Z. In the example shown in FIG. 13, the helical pitch P10 and the helical pitch P20 are different from each other, and the helical pitch P10 is greater than the helical pitch P20 (P10>P20). Note that the helical pitch P20 may be greater than the helical pitch P10.

As described above, the selective reflection band in a liquid crystal layer is proportional to the helical pitch. Therefore, since the liquid crystal layers LC1 and LC2 comprise cholesteric liquid crystals of different helical pitches, respectively, the selective reflection band of the liquid crystal optical element 1 can be enlarged.

FIG. 14 is a cross-sectional view showing another configuration example of the liquid crystal optical element 1.

The example shown in FIG. 14 is different from the example shown in FIG. 13 in that the cholesteric liquid crystal CL1 turns in the opposite direction to that of the cholesteric liquid crystal CL2. In the example shown in FIG. 14, the helical axis AX1 and the helical axis AX2 are parallel to each other, and the helical pitch P10 and the helical pitch P20 are substantially equal. Note that the helical pitch P10 may be different from the helical pitch P20.

Thus, the liquid crystal layer LC1 and the liquid crystal layer LC2 can reflect both of right-handed circularly polarized light and left-handed circularly polarized light.

The examples shown in FIG. 13 and FIG. 14 illustrate cases where the liquid crystal optical element 1 comprises two liquid crystal layers, but the liquid crystal optical element 1 is not limited to these cases. The liquid crystal optical element 1 may comprise three or more liquid crystal layers.

A manufacturing method of the liquid crystal optical element 1 shown in FIG. 13 or FIG. 14 will be described with reference to FIG. 15.

First, the alignment control layer 20 and the liquid crystal layer LC1 are formed through steps ST1 to ST4 described with reference to FIG. 7.

Then, in step ST5, a transparent material 40M for forming the alignment control layer 40 is applied on the liquid crystal layer LC1. The material 40M applied here is one of the crosslinkable liquid crystal polymers shown in FIG. 2 to FIG. 4. These liquid crystal polymers hardly penetrate and diffuse through the liquid crystal layer LC1, compared to low molecular weight materials. Thus, the fluctuations of the helical pitch P10 of the cholesteric liquid crystals CL1 in the liquid crystal layer LC1 are suppressed.

Then, in step ST6, a mold MD in which recessed portions corresponding to the shapes of the projections 41 are formed in advance is prepared, the mold MD is overlaid on the material 40M, and the material 40M is cured by applying the thermal nanoimprint method or the photo-nanoimprint method.

Then, in step ST7, the mold MD is removed. The alignment control layer 40 comprising the projections 41 is thereby formed.

Then, in step ST8, the liquid crystal layer LC2 is formed on the alignment control layer 40. The liquid crystal layer LC2 is formed, for example, in the following manner. First, a liquid crystal material is applied to be in contact with the alignment control layer 40. Then, in a state where liquid crystal molecules included in the liquid crystal material are aligned in a predetermined direction by the alignment control layer 40, light such as ultraviolet rays is irradiated and the liquid crystal material is cured. The liquid crystal layer LC2 is thereby formed.

An application example of the liquid crystal optical element 1 will be described next.

FIG. 16 is a cross-sectional view for explaining a photovoltaic cell device 100 which is the application example of the liquid crystal optical element 1.

The photovoltaic cell device 100 comprises the liquid crystal optical element 1, a photoelectric conversion element PV, and a protective layer 50. The liquid crystal optical element 1 is configured, for example, as in the example shown in FIG. 14. That is, the cholesteric liquid crystals CL1 of the liquid crystal layer LC1 turn in the opposite direction to that of the cholesteric liquid crystals CL2 of the liquid crystal layer LC2. Note that the helical axis AX1 and the helical axis AX2 are parallel to each other, and the helical pitch P10 and the helical pitch P20 are substantially equal.

The photoelectric conversion element PV is opposed to a side surface S1 of the substrate 10, and is attached to the side surface S1 by a transparent adhesive layer. The protective layer 50 is a transparent substrate, and covers the surface of the liquid crystal layer LC2.

In the liquid crystal optical element 1, the refractive index of the alignment control layer 20 is different from the refractive index of the liquid crystal layer LC1. In addition, the refractive index of the alignment control layer 40 is different from the refractive index of the liquid crystal layer LC2. If the alignment control layers 20 and 40 and the liquid crystal layers LC1 and LC2 have refractive anisotropy, their refractive indices are the average refractive indices corresponding to the average value of a refractive index for extraordinary light and a refractive index for ordinary light.

The operation of the photovoltaic cell device 100 will be described next.

Light LTi incident on the photovoltaic cell device 100 is, for example, solar light. That is, light LTi includes infrared rays in addition to visible light.

Light LTi is transmitted through the substrate 10 and the alignment control layer 20, and is incident on the liquid crystal layer LC1. At this time, since the refractive index of the alignment control layer 20 is different from the refractive index of the liquid crystal layer LC1, incident light LTi is refracted at the interface between the alignment control layer 20 and the liquid crystal layer LC1. Then, the liquid crystal layer LC1 reflects light LTr1, which is part of light LTi, at the reflective surface R1 toward the substrate 10, and transmits the other light LTt.

Light LTt transmitted through the liquid crystal layer LC1 is transmitted through the alignment control layer 40 and is incident on the liquid crystal layer LC2. At this time, since the refractive index of the alignment control layer 40 is different from the refractive index of the liquid crystal layer LC2, incident light LTt is refracted at the interface between the alignment control layer 40 and the liquid crystal layer LC2. Then, the liquid crystal layer LC2 reflects light LTr2, which is part of light LTt, at a reflective surface R2 toward the substrate 10, and transmits the other light LTt.

For example, the liquid crystal layers LC1 and LC2 are configured to reflect infrared rays. First circularly polarized light I1 of the infrared rays corresponds to light LTr1, and is reflected at the reflective surface R1 formed in the liquid crystal layer LC1. In addition, second circularly polarized light I2 which is circularly polarized in the opposite direction to that of first circularly polarized light I1, of the infrared rays, corresponds to light LTr2, and is reflected at the reflective surface R2 formed in the liquid crystal layer LC2. Light LTt transmitted through the liquid crystal layer LC2 and the protective layer 50 is light of a wavelength different from that of the infrared rays, and includes visible light.

Light LTr1 reflected by the liquid crystal layer LC1 and light LTr2 reflected by the liquid crystal layer LC2 are totally reflected at the interface between the substrate 10 and an air layer. Then, light LTr1 and light LTr2 are transmitted through the side surface S1 while being reflected repeatedly in the liquid crystal optical element 1. The photoelectric conversion element PV receives light LTr1 and light LTr2 (first circularly polarized light I1 and second circularly polarized light I2 of the infrared rays) transmitted through the side surface S1, and generates power.

The above-described photovoltaic cell device 100 can guide light of a wavelength necessary for power generation of incident light to the photoelectric conversion element PV efficiently.

As described above, the present embodiment can provide a liquid crystal optical element which can suppress an alignment defect in liquid crystal molecules.

In the present embodiment, the liquid crystal layer LC1 corresponds to a first liquid crystal layer, the liquid crystal layer LC2 corresponds to a second liquid crystal layer, the cholesteric liquid crystals CL1 correspond to first cholesteric liquid crystals, the cholesteric liquid crystals CL2 correspond to second cholesteric liquid crystals, the alignment control layer 20 corresponds to a first alignment control layer, and the alignment control layer 40 corresponds to a second alignment control layer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A liquid crystal optical element comprising:
a substrate;
a first alignment control layer disposed on the substrate and comprising projections arranged at a predetermined pitch; and
a first liquid crystal layer disposed on the first alignment control layer, wherein
the first liquid crystal layer comprises liquid crystal molecules which are aligned such that major axes of the liquid crystal molecules extend along the projections, respectively, and cured in a state where alignment directions of the liquid crystal molecules are fixed,
the first liquid crystal layer comprises a first cholesteric liquid crystal composed of the liquid crystal molecules stacked helically in a thickness direction while being turned, and
the first alignment control layer is formed of a crosslinkable liquid crystal polymer.

2. The liquid crystal optical element of claim 1, wherein the liquid crystal polymer includes a photo-alignable chromophore as a side chain.

3. The liquid crystal optical element of claim 1, wherein a thickness of the projections is greater than a width of the projections.

4. The liquid crystal optical element of claim 1, wherein a length between adjacent projections of the projections is less than a thickness of the projections.

5. The liquid crystal optical element of claim 1, wherein the first liquid crystal layer comprises a first layer covering the first alignment control layer and a second layer disposed on the first layer,
the first layer comprises a nematic liquid crystal in which the alignment directions of the liquid crystal molecules are identical, and
the second layer comprises the first cholesteric liquid crystal.

6. The liquid crystal optical element of claim 1, wherein in plan view, the projections include a first projection which is curved and a second projection which extends straight.

7. The liquid crystal optical element of claim 1, wherein in plan view, the projections include a first projection and a second projection which extend straight, and
an extension direction of the first projection is different from an extension direction of the second projection.

8. A liquid crystal optical element comprising:
a substrate;
a first alignment control layer disposed on the substrate and comprising projections arranged at a predetermined pitch;
a first liquid crystal layer disposed on the first alignment control layer;
a second alignment control layer disposed on the first liquid crystal layer and comprising projections arranged at a predetermined pitch; and a second liquid crystal layer disposed on the second alignment control layer, wherein
the first liquid crystal layer comprises liquid crystal molecules which are aligned such that major axes of the liquid crystal molecules extend along the projections, respectively, and cured in a state where alignment directions of the liquid crystal molecules are fixed,
the first alignment control layer is formed of a crosslinkable liquid crystal polymer,
the second liquid crystal layer comprises liquid crystal molecules which are aligned such that major axes of the liquid crystal molecules extend along the projections of the second alignment control layer, respectively, and cured in a state where alignment directions of the liquid crystal molecules are fixed, and
the second alignment control layer is formed of a crosslinkable liquid crystal polymer.

9. The liquid crystal optical element of claim 8, wherein the first liquid crystal layer comprises a first cholesteric liquid crystal,
the second liquid crystal layer comprises a second cholesteric liquid crystal, and
a helical pitch of the first cholesteric liquid crystal is different from a helical pitch of the second cholesteric liquid crystal.

10. The liquid crystal optical element of claim 8, wherein the first liquid crystal layer comprises a first cholesteric liquid crystal,
the second liquid crystal layer comprises a second cholesteric liquid crystal, and
the first cholesteric liquid crystal turns in an opposite direction to a direction of the second cholesteric liquid crystal.

11. The liquid crystal optical element of claim 1, wherein a refractive index of the first alignment control layer is different from a refractive index of the first liquid crystal layer.

12. A manufacturing method of a liquid crystal optical element, comprising:
applying a crosslinkable liquid crystal polymer on a substrate and forming a first alignment control layer comprising projections arranged at a predetermined pitch by a thermal nanoimprint method or a photo-nanoimprint method;
applying a liquid crystal material on the first alignment control layer, curing the liquid crystal material in a state where liquid crystal molecules included in the liquid crystal material are aligned in a predetermined direction according to alignment restriction force of the first alignment control layer, to form a first liquid crystal layer;
applying a crosslinkable liquid crystal polymer on the first liquid crystal layer, and forming a second alignment control layer comprising projections arranged at a predetermined pitch by the thermal nanoimprint method or the photo-nanoimprint method; and
applying a liquid crystal material on the second alignment control layer, curing the liquid crystal material in a state where liquid crystal molecules included in the liquid crystal material are aligned in a predetermined direction according to alignment restriction force of the second alignment control layer, to form a second liquid crystal layer.

13. The manufacturing method of the liquid crystal optical element of claim 12, wherein
the liquid crystal polymer includes a photo-alignable chromophore as a side chain, and before the liquid crystal material is applied, the first alignment control layer is irradiated with linearly polarized ultraviolet rays.

\* \* \* \* \*